United States Patent
Ducaroir et al.

(10) Patent No.: US 6,331,999 B1
(45) Date of Patent: Dec. 18, 2001

(54) SERIAL DATA TRANSCEIVER ARCHITECTURE AND TEST METHOD FOR MEASURING THE AMOUNT OF JITTER WITHIN A SERIAL DATA STREAM

(75) Inventors: Francois Ducaroir, Santa Clara; Karl S. Nakamura, Palo Alto; Michael O. Jenkins, San Jose, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/007,490

(22) Filed: Jan. 15, 1998

(51) Int. Cl.[7] .................................................. H04B 3/46
(52) U.S. Cl. ........................ 375/226; 375/376; 375/327; 375/221
(58) Field of Search ................................. 375/226, 376, 375/327, 221; 327/12; 331/4

(56) References Cited

U.S. PATENT DOCUMENTS

| | | |
|---|---|---|
| 4,048,445 | 9/1977 | Ghisler . |
| 4,308,472 | 12/1981 | McLaughlin . |
| 4,402,075 | 8/1983 | Bargeton et al. . |
| 4,419,633 | 12/1983 | Phillips . |
| 4,529,979 | 7/1985 | Kusama et al. . |
| 4,564,933 | 1/1986 | Hirst . |
| 4,573,017 | 2/1986 | Levine . |
| 4,575,841 | 3/1986 | Fagerstedt et al. . |
| 4,575,864 | 3/1986 | Rice, Jr. et al. . |
| 4,613,979 | 9/1986 | Kent . |
| 4,751,469 | 6/1988 | Nakagawa et al. . |
| 4,806,878 | 2/1989 | Cowley . |
| 4,947,407 * | 8/1990 | Silvian ................................ 375/340 |
| 4,988,901 | 1/1991 | Kamuro et al. . |
| 5,028,813 | 7/1991 | Hauck et al. . |
| 5,043,976 | 8/1991 | Abiven et al. . |
| 5,059,924 * | 10/1991 | Jenningscheck ..................... 331/1 A |
| 5,088,112 | 2/1992 | Pyhalammi et al. . |
| 5,126,690 | 6/1992 | Bui et al. . |
| 5,159,279 | 10/1992 | Shenoi et al. . |
| 5,180,993 | 1/1993 | Dent . |
| 5,200,979 | 4/1993 | Harris . |
| 5,251,217 | 10/1993 | Travers et al. . |
| 5,268,652 | 12/1993 | Lafon . |
| 5,274,668 * | 12/1993 | Marschall ............................. 375/224 |
| 5,301,207 | 4/1994 | Emerson et al. . |
| 5,327,103 | 7/1994 | Baron et al. . |
| 5,343,461 * | 8/1994 | Barton et al. ........................ 370/249 |
| 5,379,409 | 1/1995 | Ishikawa . |
| 5,398,270 | 3/1995 | Cho et al. . |
| 5,506,627 * | 4/1996 | Cairdi ................................... 348/515 |

(List continued on next page.)

Primary Examiner—Chi Pham
Assistant Examiner—Kevin M Burd

(57) ABSTRACT

A serial data transceiver architecture and test method are presented for measuring the amount of jitter within a serial data stream. A transmitter of the transceiver receives parallel input data at a transmit data input port, converts the parallel input data to a serial data stream having data windows separated by data transition periods, and produces the serial data stream at a transmitter output port. A receiver of the transceiver receives a serial data stream at a receiver input port, converts the serial data stream to parallel output data, and provides the parallel output data at a receive data output port. The receiver includes a deserializer which receives the serial data stream, recovers the transmit clock signal used to transmit the serial data from the serial data stream, generates a timing signal based upon the recovered transmit clock signal, samples the serial data stream using the timing signal in order to recover the data from the serial data stream, aligns the deserialized data into parallel units, and provides the resulting parallel data at the receive data output port. The deserializer samples the serial data stream within each data window dependent upon the duty cycle of the timing signal. The deserializer varies the duty cycle of the timing signal according to a received control signal in order to facilitate measurement of the amount of jitter within the serial data stream.

14 Claims, 5 Drawing Sheets

U.S. PATENT DOCUMENTS

| | | | |
|---|---|---|---|
| 5,541,556 | * | 7/1996 | Francis .................................... 331/4 |
| 5,550,802 | | 8/1996 | Worsley et al. . |
| 5,559,854 | | 9/1996 | Suzuki . |
| 5,638,518 | * | 6/1997 | Malladi ................................ 709/251 |
| 5,787,114 | | 7/1998 | Ramamurthy et al. . |
| 5,790,563 | * | 8/1998 | Ramamurthy et al. ............... 714/736 |
| 5,793,822 | * | 8/1998 | Anderson et al. .................... 375/371 |
| 5,926,041 | * | 7/1999 | Duffy et al. ............................ 327/12 |
| 5,950,115 | * | 9/1999 | Momtaz et al. ........................ 455/73 |
| 5,956,370 | * | 9/1999 | Ducaroir et al. ..................... 375/221 |

* cited by examiner

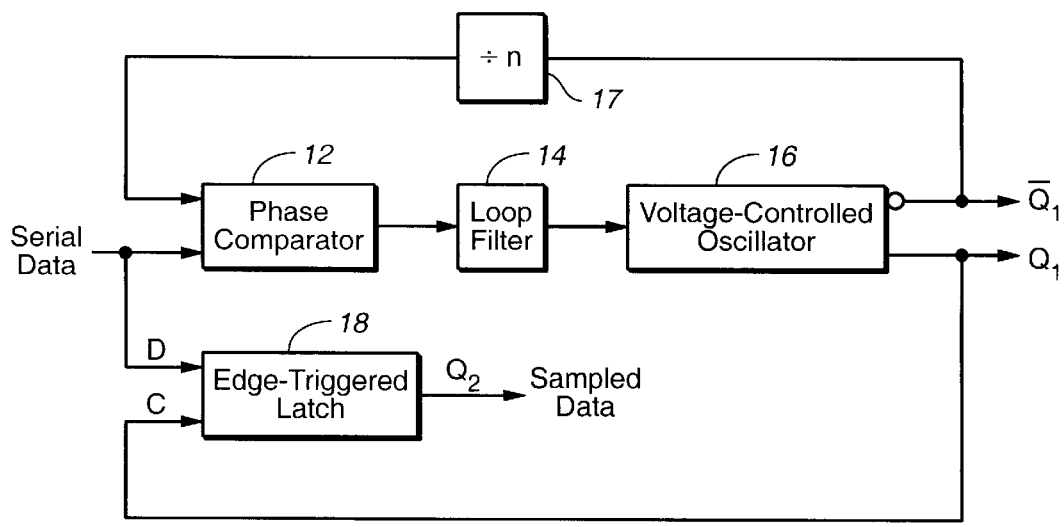
FIG._1 (PRIOR ART)
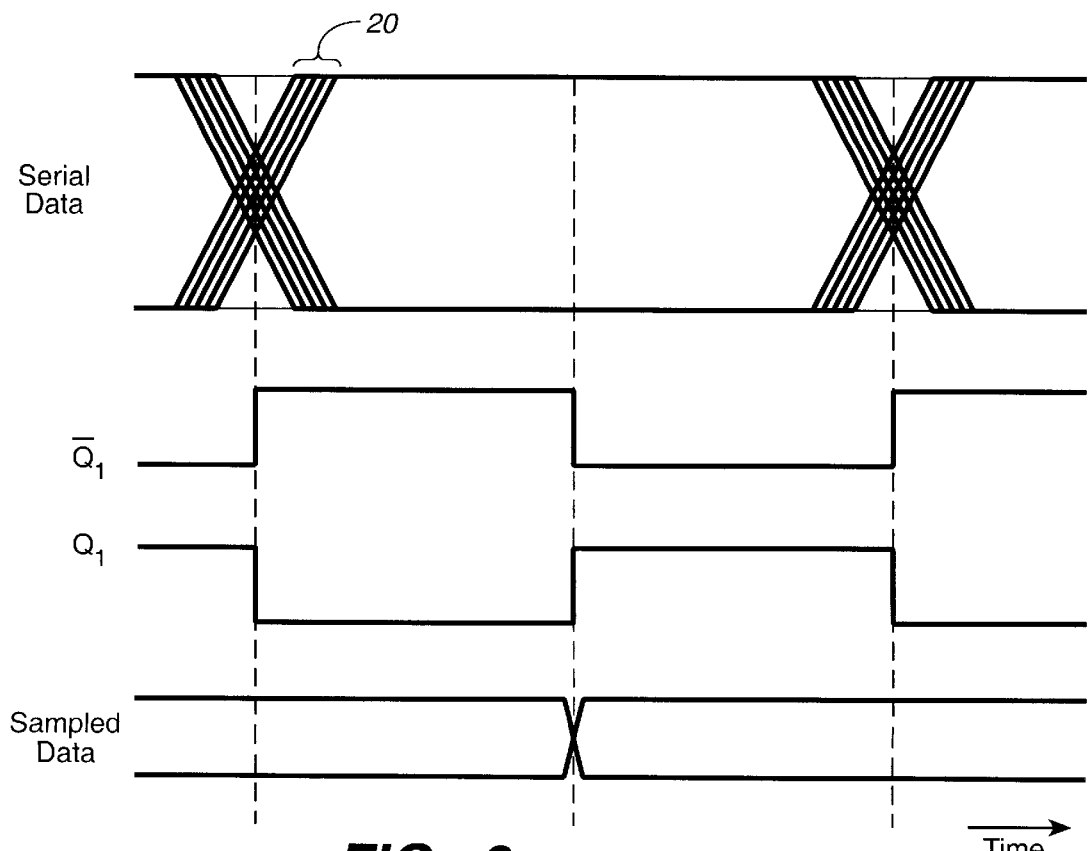
FIG._2 (PRIOR ART)

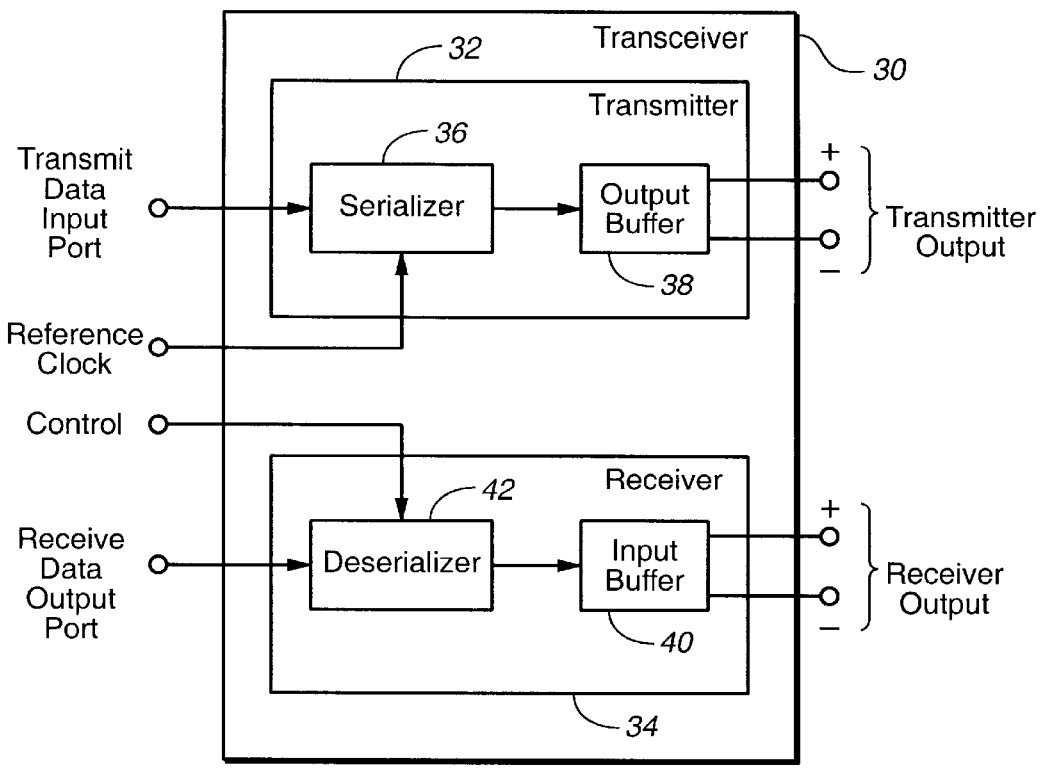
FIG._3
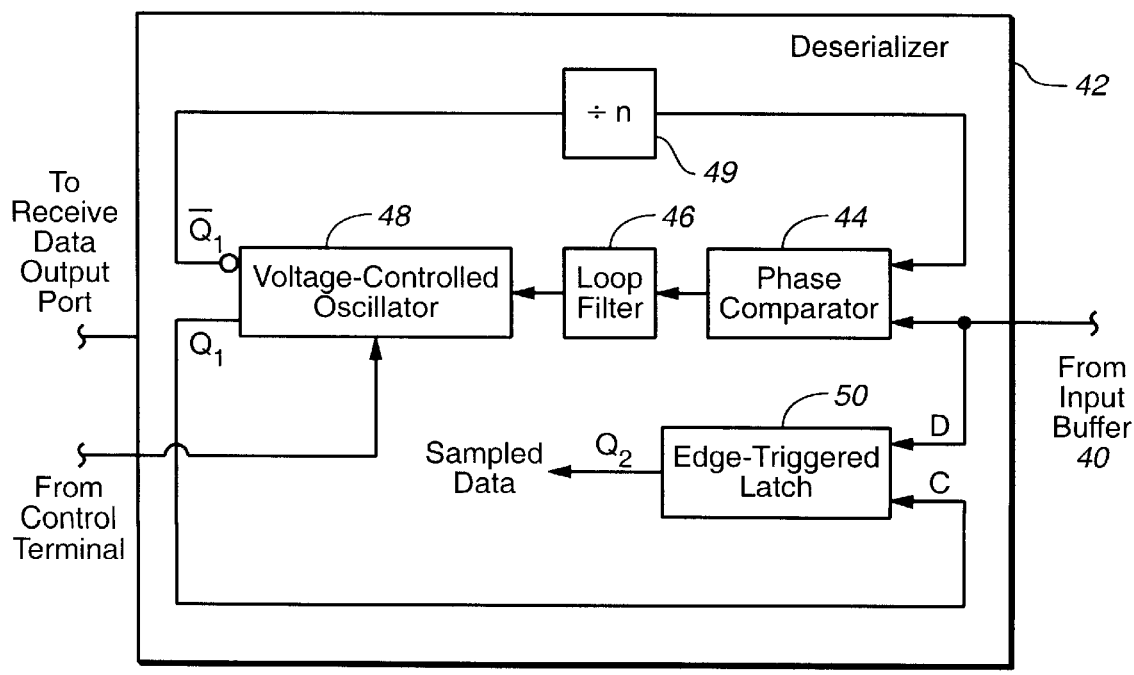
FIG._4

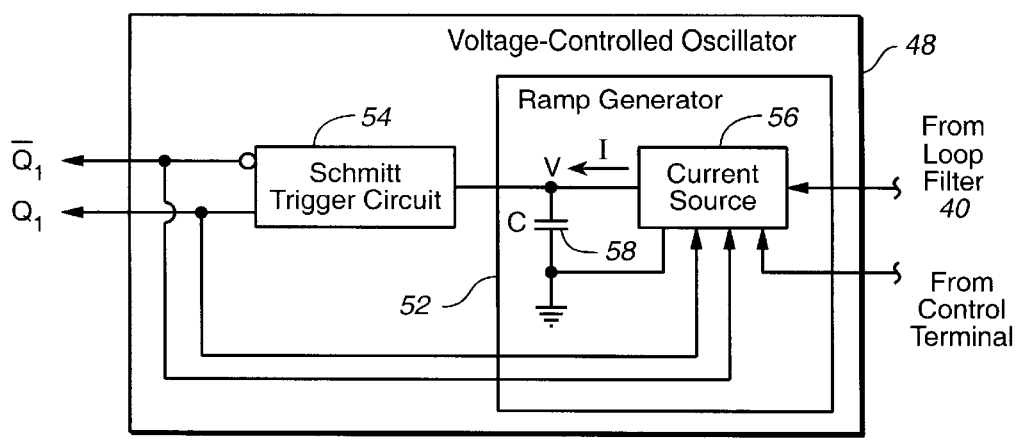
FIG._5
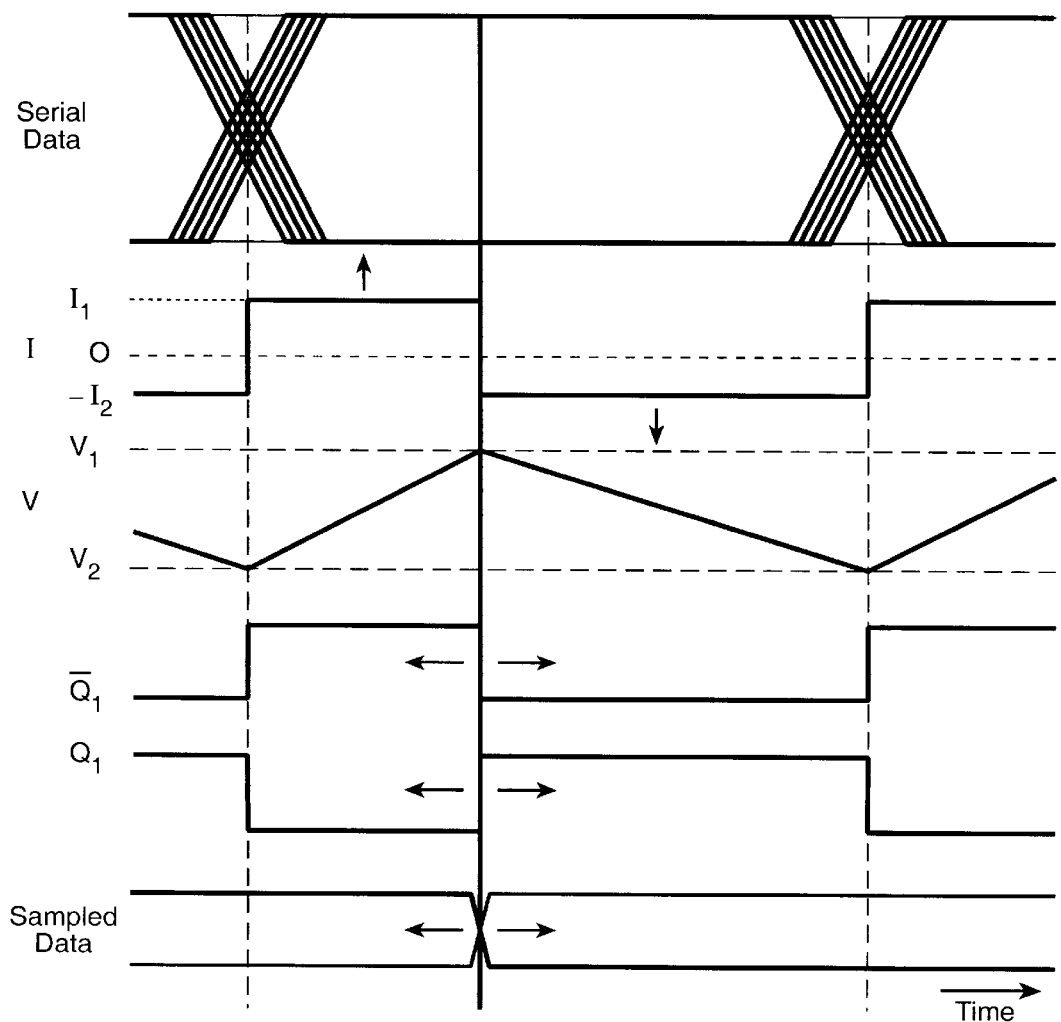
FIG._6

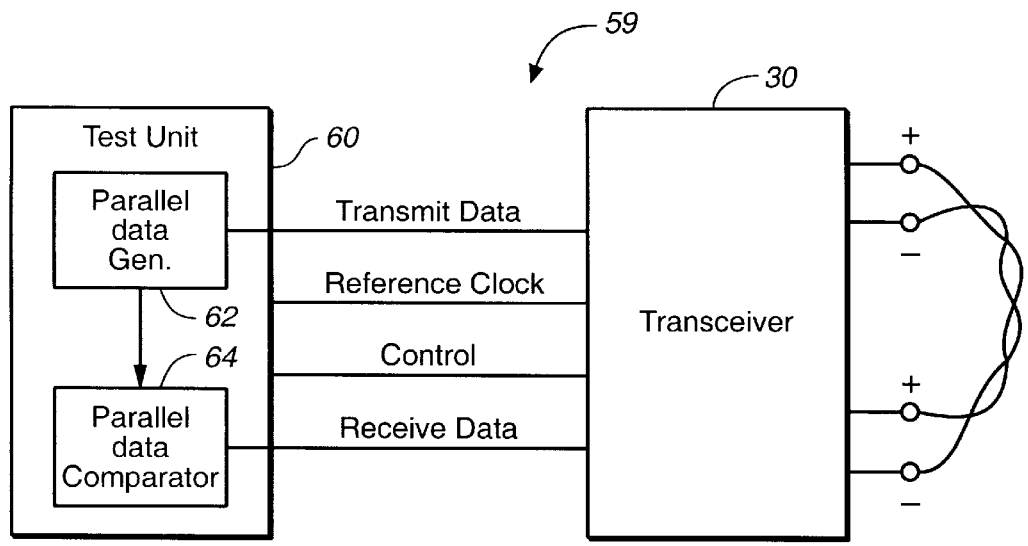
FIG._7
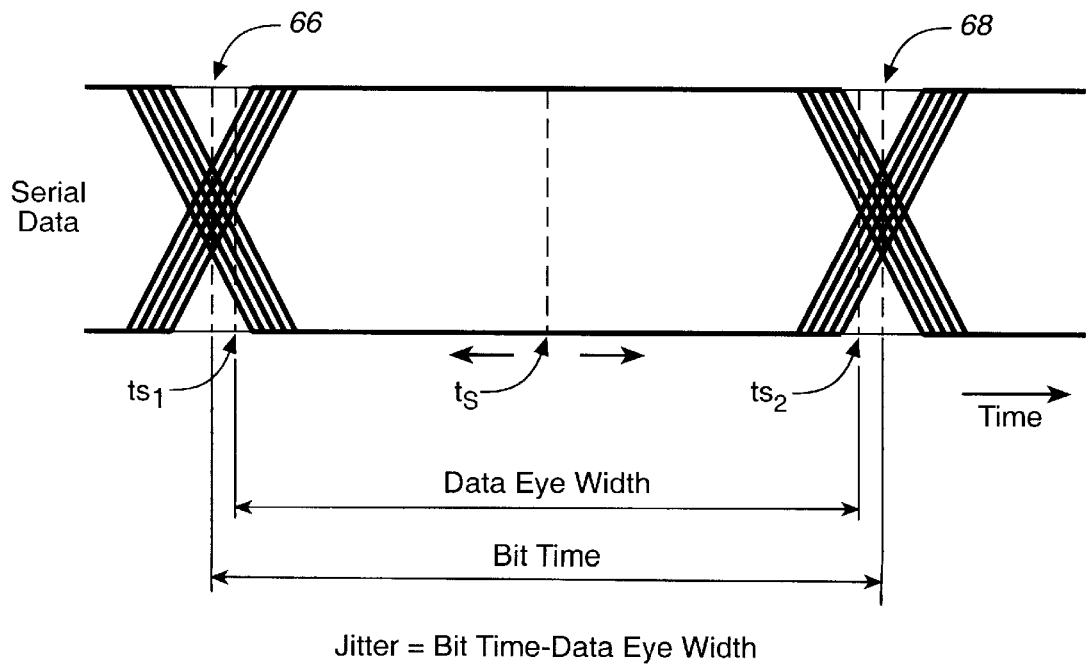
Jitter = Bit Time-Data Eye Width
FIG._8

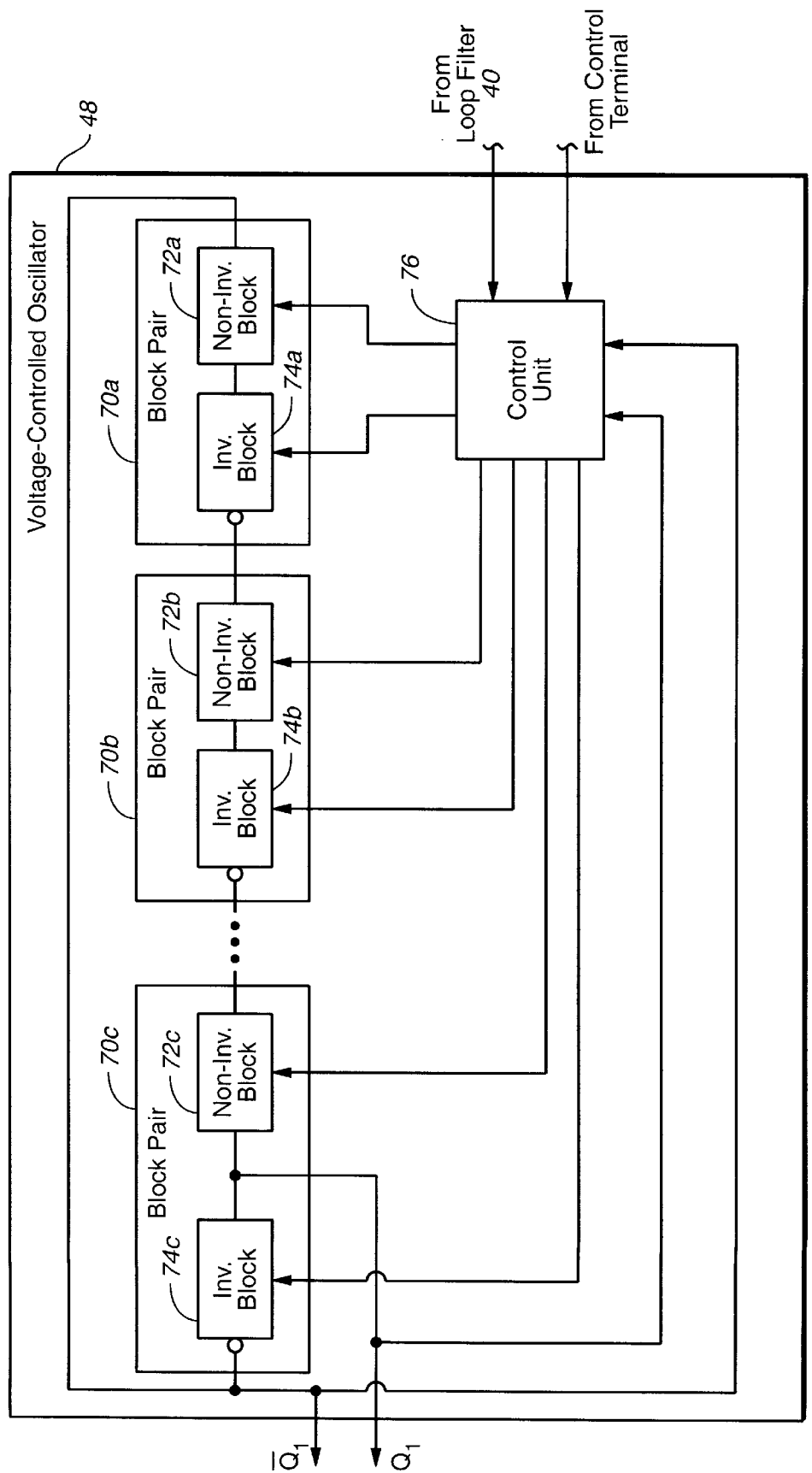
FIG._9

SERIAL DATA TRANSCEIVER ARCHITECTURE AND TEST METHOD FOR MEASURING THE AMOUNT OF JITTER WITHIN A SERIAL DATA STREAM

BACKGROUND OF THE INVENTION

1. Field of the Invention

This invention relates to digital data communication circuits, and more particularly to the testing of serial data communication circuits.

2. Description of the Relevant Art

Electronic devices typically communicate via electrical signals (e.g., voltage and/or current) driven upon electrical conductors (e.g., metal wires). Simultaneous transmission of multiple signals is accommodated by several wires routed in parallel (i.e., buses). Most computer systems have a modular architecture centered around a bus which serves as a shared communication link between system components. The two major advantages of shared buses over direct communication links between system components are versatility and low cost. By defining a standard interconnection scheme for a given bus, new devices may be easily connected to the bus. The cost of the bus is low because it is shared among the number of components connected to the bus.

Due to technological advances, the signal processing capabilities of more modern electronic devices (e.g., microprocessors) are outstripping the signal transfer capabilities of conventional parallel buses. To their detriment, parallel buses have physical limitations which place an upper limit on the rate at which information can be transferred over the bus. For example, the electrical characteristics and loading of each wire of a bus may vary, causing signals transmitted simultaneously upon the bus to be received at different times. Bus timing must take into consideration worst case delays, resulting in reduced data transfer rates of systems employing parallel buses.

A serial data path, on the other hand, is a direct communication link between a single transmitter and a single receiver. Such a serial data path typically includes a dedicated transmission medium connected between the transmitter and receiver. The transmission medium may be, for example, a differentially-driven pair of wires or a fiber-optic cable. In cases where the transmission medium is a pair of wires, the communication link (i.e., channel) has a defined electrical loading and is typically optimized for minimum signal delay. As a result, the rate at which electrical signals can be transferred over such a serial data path exceeds the data transfer rate of a common shared parallel bus.

A typical serial data transceiver includes a transmitter and a receiver. The transmitter receives parallel data at an input port, converts the parallel data to a serial data stream in response to a transmit clock signal, and provides the serial data stream at an output port. The serial data stream includes data "windows" between data transition periods. The receiver receives a serial data stream at an input port, converts the serial data stream to parallel data, and provides the parallel data at an output port.

Serial data streams are typically self-clocking. That is to say the transmit clock signal used to transmit the data contains timing information necessary to extract the data from the serial data stream. Both the data and the timing information (i.e., the transmit clock signal) are discernible within the serial data stream. A given receiver typically recovers the transmit clock signal from the serial data stream and uses the transmit clock signal to recover the data. The receiver typically uses the recovered transmit clock signal to sample the serial data stream in the center of the data windows of the serial data stream (i.e., midway between the data transitions).

A variety of noise sources can cause the amount of time between data transitions of a serial data stream to fluctuate or "jitter". A practical receiver must be able to accurately extract the data from the serial data stream despite the presence of a certain amount of jitter in the input serial data stream. For this reason, receivers typically include phase-locked loop ("PLL") circuitry to recover transmit clock signals from serial data streams. The use of PLL circuitry provides some immunity to jitter in the serial data stream.

FIG. 1 is a block diagram of a typical PLL clock signal recovery/data sampling circuit 10 used within a serial data receiver. PLL clock signal recovery/data sampling circuit 10 includes a phase comparator 12, a loop filter 14, a voltage-controlled oscillator ("VCO") 16, a divide-by-n circuit 17, and an edge-triggered latch 18. Phase comparator 12 receives a frequency-divided $Q_1'$ signal produced by divide-by-n circuit 17 (i.e., a frequency-divided clock signal) and a serial data stream. Phase comparator 12 produces an a.c. error signal having a short term average value substantially proportional to the phase difference between the frequency-divided $Q_1'$ signal and the serial data stream. Loop filter 14 may be, for example, a low pass filter. Loop filter 14 receives the a.c. error signal and produces a low pass filtered error signal substantially proportional to the short term average value of the a.c. error signal. VCO 16 then produces the $Q_1'$ output signal and a complementary $Q_1$ output signal. The frequencies of the $Q_1'$ and $Q_1$ output signals are dependent upon the error signal and the number n, where n is an integer greater than or equal to 1 as described below. When n=1, the $Q_1$ output signal of VCO 16 is the transmit clock signal recovered from the serial data stream. Divide-by-n circuit 17 receives the $Q_1'$ output signal and divides the frequency of the $Q_1'$ output signal by a number n, where n is an integer greater than or equal to 1, producing the frequency-divided $Q_1'$ signal. Edge-triggered latch 18 recovers the serial data from the serial data stream using the $Q_1$ output signal. Edge-triggered latch 18 samples the serial data stream (at a data or "D" input) upon the rising edge of the $Q_1$ output signal (at a clock signal or "C" input), producing sampled serial data at a $Q_2$ output.

FIG. 2 is a timing diagram showing the temporal relationships between the serial data, $Q_1'$ and $Q_1$ output signals, and the sampled serial data, for n=1. The serial data stream includes data "windows" separated by data transition periods. Parallel lines 20 represent jitter existing within the serial data stream. VCO 16 produces output signal $Q_1'$ having rising edges synchronized to data transitions within the serial data stream. Output signal $Q_1$ is the complement of signal $Q_1'$, and has rising edges nominally midway between the data transitions of the serial data stream. Edge-triggered latch 18 produces the sampled serial data in response to the rising edges of signal $Q_1$, thus edge-triggered latch 18 samples the serial data edges nominally midway between the data transitions. As sampling the serial data near one of the data transitions on either side of a data window may result in an error, this data sampling method minimizes the chance of an error occurring during data sampling.

Serial data transceivers offering, digital signal transmission rates exceeding 1 gigabit per second are now commercially available. The testing of such transceivers at their normal operating speeds, however, presents many technical challenges. Serial data transceiver test methods must verify that a given transmitter produces a serial data stream having less than or equal to a specified maximum amount of jitter. It would thus be beneficial to include testing elements within a serial data transceiver to facilitate measurement of an amount of jitter present within a serial data stream produced by a high-speed transmitter having an extremely short data window. Measuring jitter is important, especially in high speed applications, since knowledge gained from jitter testing can be used to direct a more appropriate sampling position within relatively short data windows.

SUMMARY OF THE INVENTION

The problems outlined above are in large part solved by a serial data transceiver architecture and test method for measuring the amount of jitter within a serial data stream. The serial data transceiver includes a transmitter and a receiver formed upon a monolithic semiconductor substrate. The transmitter receives parallel input data at a transmit data input port, converts the parallel input data to a serial data stream having data windows separated by data transition periods, and produces the serial data stream at a transmitter output port. The receiver receives a serial data stream at a receiver input port, converts the serial data stream to parallel output data, and provides the parallel output data at a receive data output port. The receiver includes a deserializer which receives the serial data stream, recovers the transmit clock signal used to transmit the serial data from the serial data stream, generates a timing signal based upon the recovered transmit clock signal, samples the serial data stream using the timing signal in order to recover the data from the serial data stream, aligns the deserialized data into parallel units, and provides the resulting parallel data at the receive data output port. The deserializer samples the serial data stream within each data window dependent upon the duty cycle of the timing signal. The deserializer varies the duty cycle of the timing signal according to a received control signal in order to facilitate measurement of the amount of jitter within the serial data stream.

The deserializer includes a PLL circuit having a phase comparator, a loop filter, a VCO, and a divide-by-n circuit. The phase comparator receives the serial data stream and a frequency-divided clock signal, and produces an a.c. error signal having a short term average value substantially proportional to the phase difference between the serial data stream and the frequency-divided clock signal. The loop filter receives the a.c. error signal and produces a low pass filtered error signal substantially proportional to the short term average value of the a.c. error signal. The VCO receives the filtered error signal and the control signal and produces the clock signal and the timing signal. The frequency of the clock signal is dependent upon the filtered error signal and the number n, and the duty cycle of the timing signal is dependent upon the value of the control signal. The divide-by-n circuit receives the clock signal and divides the frequency of the clock signal by a number n to produce the frequency-divided clock signal, where n is an integer greater than or equal to 1.

In one embodiment, the VCO includes a ramp generator coupled to a Schmitt trigger circuit. The ramp generator produces an output voltage which alternately increases and decreases linearly with time. The Schmitt trigger circuit produces the clock signal and the timing signal in response to the ramp generator output voltage. The ramp generator may include a current source coupled to a capacitor. In this case, the output of the current source alternates between two constant levels, and the capacitor integrates the output of the current source with time to produce the ramp generator output voltage. The current source adjusts the values of the two constant levels in response to the filtered error signal produced by the loop filter in order to maintain the period of the clock signal substantially equal to the time interval between the data transitions of the serial data stream. The current source also adjusts the values of the two constant levels in response to the control signal in order to alter the duty cycle of the timing signal.

In an alternate embodiment, the VCO includes an odd number of pairs of non-inverting and inverting logic blocks arranged in a recirculating loop. The number of pairs is also equal to half the number of bits per parallel data unit. One of the pairs of logic blocks is configured to produce the clock signal and the timing signal. Each logic block exhibits a time delay between reception of an input signal and production of an output signal. The time delay is variable and dependent upon a delay control signal. A control unit coupled to each logic block produces the delay control signal for each logic block. The control unit produces the delay control signals in response to the filtered error signal from the loop filter such that the period of the recovered transmit clock signal is substantially equal to the time interval between the data transitions of the serial data stream. The control unit also produces the delay control signals in response to the control signal in order to alter the duty cycle of the timing signal.

A system for testing the serial data transceiver in accordance with the present invention includes the serial data transceiver and a test unit. The test unit includes a parallel data generator coupled to the transmit data input port and a parallel data comparator coupled to the parallel data generator and to the receive data output port. The transmitter output port of the transceiver is coupled to the receiver input port. The parallel data generator generates parallel input test data and provides the parallel input test data to the transmit data input port. The parallel data comparator receives parallel output test data produced by the receiver and the parallel input test data produced by parallel data generator, and compares the parallel output test data to the parallel input test data. The test unit produces the control signal such that the duty cycle of the timing signal is varied. A match between the parallel output test data and the parallel input test data (i.e., a one-to-one correspondence between the logic levels of the bit positions of the parallel output test data and the parallel input test data) verifies proper operation of the transceiver and the absence of jitter at a given sampling point within the data window. Any discrepancy between the parallel output test data to the parallel input test data is indicative of jitter within the serial data stream at the sampling time determined by the control signal.

A method for testing the serial data transceiver according to the present invention includes providing the serial data transceiver and coupling the transmitter output port to the receiver input port. The following sequence of steps is repeated until a difference between parallel input test data and parallel output test data is observed:

1) The control signal is varied such that the sampling time occurs earlier within each data window;
2) Parallel input test data is provided to the transmit data input port;
3) Parallel output test data is received from the receive data output port; and
4) The parallel output test data is compared to the parallel input test data.

When a difference between the parallel input test data and the parallel output test data is observed, a "leading edge" of the data window has been located, and the value of the control signal is recorded as a first control signal value. The following sequence of steps is then repeated until a difference between the parallel input test data and the parallel output test data is again observed:

1) The control signal is varied such that the sampling time occurs later within each data window;
2) Parallel input test data is provided to the transmit data input port;
3) Parallel output test data is received from the receive data output port; and
4) The parallel output test data is compared to the parallel input test data.

When a difference between the parallel input test data and the parallel output test data is again observed, a "trailing edge" of the data window has been located, and the value of the control signal is recorded as a second control signal value. The first control signal value is subtracted from the second control signal value in order to determine the width of each data window. The data window width is subtracted from the bit time of the serial data stream in order to determine the amount of jitter present within the serial data stream.

BRIEF DESCRIPTION OF THE DRAWINGS

Other objects and advantages of the invention will become apparent upon reading the following detailed description and upon reference to the accompanying drawings in which:

FIG. 1 is a block diagram of a typical PLL clock signal recovery/data sampling circuit used within a serial data receiver, wherein the PLL clock signal recovery/data sampling circuit includes a phase comparator, a loop filter, a VCO, a divide-by-n circuit, and an edge-triggered latch;

FIG. 2 is a timing diagram showing the temporal relationships between signals within the PLL clock signal recovery/data sampling circuit of FIG. 1 for n=1, wherein the serial data stream includes data "windows" separated by data transition periods, and wherein the serial data stream is sampled within the data windows and nominally midway between the data transitions;

FIG. 3 is a block diagram of one embodiment of a serial data transceiver of the present invention, wherein the serial data transceiver includes a transmitter and a receiver; and wherein the receiver includes a deserializer which receives a serial data stream, recovers a transmit clock signal used to transmit the serial data from the serial data stream, generates a timing signal based upon the recovered transmit clock signal, samples the serial data stream within a data window dependent upon the duty cycle of a received control signal, aligns the deserialized data into parallel units, and provides the resulting parallel data at the receive data output port;

FIG. 4 is a block diagram of one embodiment of the deserializer of FIG. 3 including a PLL circuit having a phase comparator, a loop filter, a VCO, and a divide-by-n circuit, wherein the VCO produces a clock signal and the timing signal, and wherein the serial data stream is sampled within each data window dependent upon the duty cycle of the timing signal, and wherein the VCO varies the duty cycle of the timing signal according to a received control signal in order to facilitate measurement of the amount of jitter within the serial data stream;

FIG. 5 is a block diagram of one embodiment of the VCO of FIG. 4, wherein the VCO includes a ramp generator coupled to a Schmitt trigger circuit, and wherein the ramp generator produces a voltage ramp which alternately increases and decreases linearly with time, and wherein the Schmitt trigger circuit receives the voltage ramp and produces the clock signal and the timing signal dependent upon the voltage ramp;

FIG. 6 is a timing diagram which illustrates the signal waveforms within the VCO embodiment of FIG. 5 for n=1;

FIG. 7 is a block diagram of a serial data transceiver testing system including a test unit coupled to a transceiver under test, wherein the test unit is used to measure the amount of jitter within a serial data stream produced by the transmitter;

FIG. 8 is a timing diagram which illustrates the operation of the serial data transceiver testing system of FIG. 7; and FIG. 9 is a block diagram of an alternate embodiment of the VCO of FIG. 4, wherein the VCO includes an odd number of pairs of non-inverting and inverting logic blocks arranged in a recirculating loop and a control unit, wherein the control unit issues delay control signals which alter the delays of the logic blocks in order to produce the clock signal and to vary the duty cycle of the timing signal.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

FIG. 3 is a block diagram of one embodiment of a serial data transceiver 30 of the present invention. Transceiver 30 includes a transmitter 32 and a receiver 34 formed upon a single monolithic semiconductor substrate. Transceiver 30 also includes a transmit data input port, a pair of polarized transmitter output terminals, a pair of polarized receiver input terminals, a receive data output port, a reference clock terminal, and a control terminal. Transmitter 32 receives parallel data from the transmit data input port, converts the parallel data to a serial data stream (i.e., serializes the parallel data), and differentially drives the pair of polarized transmitter output terminals with complementary voltage values representing the logic values of the serial data stream. Receiver 34 receives differentially-driven voltage values representing logic values of a serial data stream from the pair of polarized receiver input terminals, converts the serial data stream to parallel data (i.e., deserializes the serial data stream), and provides the parallel data at the receive data output port.

Transmitter 32 includes a serializer 36 and an output buffer 38. Serializer 36 receives parallel data at the transmit data input port in response to a reference clock signal received at the reference clock terminal. The parallel data is supplied in n-bit data units, where n is an integer greater than 1. Common data units include 8-bit "bytes", 16-bit "words", and 32-bit "double words". A clock generator within serializer 36 uses the reference clock signal to produce a transmit clock signal which has a frequency times the frequency of the reference clock signal. Serializer 36 serializes the parallel data in response to the transmit clock signal producing a serial data stream, and provides output buffer 38 with the logic values of the serial data stream. The serial data stream includes data windows separated by data transition periods. As the data transitions occur at intervals equal to the period of the transmit clock signal, the transmit clock signal is inherently present within the serial data stream. Output buffer 38 differentially drives the pair of polarized transmitter output terminals with complementary voltage values representing the logic values of the serial data stream.

Receiver 34 includes an input buffer 40 and a deserializer 42. Input buffer 40 receives a differentially-driven serial data stream from between the pair of polarized receiver input terminals and provides the corresponding logic values of the serial data stream to deserializer 42. Deserializer 42 recovers the transmit clock signal used to transmit the serial data from the serial data stream, generates a timing signal based upon the recovered transmit clock signal, samples the serial data stream using the timing signal in order to recover the data from the serial data stream, aligns the deserialized data into parallel units, and provides the resulting parallel data to the receive data output port.

The data sampling time within each data window is dependent upon the duty cycle of the timing signal. In order to facilitate measurement of the amount of jitter present within a serial data stream produced by transmitter 32, deserializer 42 also receives a control signal at the control terminal. Deserializer 42 varies the duty cycle of the timing signal in response to the control signal in order to change the sampling time within the data windows. As will be described in more detail below, the ability to change the sampling time within the data windows via the control signal facilitates measurement of the amount of jitter present within the serial data stream.

FIG. 4 is a block diagram of one embodiment of deserializer 42. In the embodiment of FIG. 4, deserializer 42 includes a PLL circuit having a phase comparator 44, a loop filter 46, a VCO 48, and a divide-by-n circuit 49. Deserializer 42 also includes an edge-triggered latch 50. Phase comparator 44 receives a serial data stream from input buffer 40 and a frequency-divided $Q_1'$ signal produced by divide-by-n circuit 49. Phase comparator 44 produces an a.c. error signal having a short term average value substantially proportional to the phase difference between the frequency-divided $Q_1'$ signal and the serial data stream. Loop filter 46 receives the a.c. error signal and produces a low pass filtered error signal substantially proportional to the short term average value of the a.c. error signal. Loop filter 46 may be, for example, a low pass filter. VCO 48 produces the $Q_1'$ output signal and a complementary $Q_1$ output signal in response to the filtered error signal. The $Q_1'$ output signal is n times the transmit clock signal recovered from the serial data stream, where n is an integer greater than or equal to 1 as described below. The complementary $Q_1$ output signal is a timing signal used to sample the serial data stream. The frequencies of the $Q_1'$ and $Q_1$ output signals are thus dependent upon the filtered error signal and the number n. Divide-by-n circuit 49 receives the $Q_1'$ output signal and divides the frequency of the $Q_1'$ output signal by a number n, where n is an integer greater than or equal to 1, producing the frequency-divided $Q_1'$ signal. Edge-triggered latch 50 recovers the serial data from the serial data stream using the $Q_1$ output signal. Edge-triggered latch 50 samples the serial data stream (at a data or "D" input) upon the rising edge of the $Q_1$ output signal (at a clock signal or "C" input), producing sampled serial data at a $Q_2$ output.

VCO 48 also receives the control signal via the control terminal. As will be described in more detail below, VCO 48 varies the duty cycle of the $Q_1$ output signal (i.e., the serial data stream sampling time within the data windows) dependent upon the value of the control signal in order to facilitate measurement of the amount of jitter present within the serial data stream.

FIG. 5 is a block diagram of one embodiment of VCO 48. In the embodiment of FIG. 5, VCO 48 includes a ramp generator 52 coupled to a Schmitt trigger circuit 54. Ramp generator produces a voltage ramp at an output terminal. The voltage ramp alternately increases and decreases linearly with time. Schmitt trigger circuit 54 receives the voltage ramp and produces output signals $Q_1$ and $Q_1'$, which vary between two discrete voltage levels, dependent upon the value of the voltage ramp. As with all Schmitt trigger circuits, a graph of the output voltage at the $Q_1$ or $Q_1'$ terminal versus the input voltage reveals different switching points (i.e., threshold values) for positive-going and negative-going inputs.

In the embodiment of FIG. 5, ramp generator 52 includes a current source 56 coupled to a capacitor 58. Current source 56 produces an output current "I" at an output terminal dependent upon the value of the filtered error signal produced by loop filter 40, the current values of output signals $Q_1$ and $Q_1'$, and the control signal from the control terminal. Capacitor 58 is coupled between the output terminal of current source 56 and a ground potential. Capacitor 58 integrates the current produced by current source 56 with time, producing the voltage ramp at the output terminal. If the output current "I" produced by current source 56 is a constant, the value of the voltage ramp at time "t" is given by:

$$V(t)=(I/C) \cdot t$$

where:
V(t)=value of voltage ramp at time "t", and
C=capacitance of capacitor 58

FIG. 6 is a timing diagram which will be used to describe the operation of the embodiment of VCO 48 shown in FIG. 5 for n=1. Current "I" produced by current source 56 alternates between two constant values $+I_1$ and $-I_2$. When output signal $Q_1'$ is a logic high, current source 56 produces current "I" with a value of $+I_1$. When output signal $Q_1$ is a logic high, current source 56 produces current "I" with a value of $-I_2$. Capacitor "C" integrates current "I" with time to form linear voltage ramp "V". Voltage ramp "V" is positive-going when output signal $Q_1'$ is a logic high, and negative-going when output signal $Q_1$ is a logic high. Schmitt trigger circuit 54 receives voltage ramp "V" and produces output signals $Q_1$ and $Q_1'$ in response to the value of voltage ramp "V". When voltage ramp "V" is positive-going, and attains a first threshold value of $V_1$, Schmitt trigger circuit 54 switches output signal $Q_1'$ from a logic high to a logic low, and switches complementary output signal $Q_1$ from a logic low to a logic high. When voltage ramp "V" is negative-going, and attains a second threshold value of $V_2$, Schmitt trigger circuit 54 switches output signal $Q_1'$ from a logic low to a logic high, and switches complementary output signal $Q_1$ from a logic low to a logic high.

The periods and duty cycles of the $Q_1$ and $Q_1'$ waveforms are determined by the relationship between values $I_1$ and $I_2$. For example, if output signal $Q_1'$ is a logic high for a time period $t_1$ while voltage ramp "V" is positive going, then a logic low for a time period $t_2$ while voltage ramp "V" is negative going, P=period of the $Q_1'$ waveform=$t_1+t_2$=C·(V1−V2)·(1/$I_1$+1/$I_2$)

D=duty cycle of the $Q_1'$ waveform=$t_1/(t_1+t_2)$=1/(1+$I_1/I_2$)

Current source 56 adjusts the values of $I_1$ and $I_2$:(i) in response to the filtered error signal produced by loop filter 40 in order to maintain the periods of the $Q_1$ and $Q_1'$ waveforms equal to the time interval between data transitions within the serial data stream, and (ii) in response to the control signal in order to alter the duty cycles of the $Q_1$ and $Q_1'$ waveforms. The duty cycle of the $Q_1$ waveform determines the data sampling time within each data window between data transitions within the serial data stream. As will be described in more detail below, the duty cycle of the $Q_1$ waveform is altered via the control signal in order to measure the "width" of the data window between data transitions. The width of the data window between data transitions is then used to determine the amount of jitter within the serial data stream.

FIG. 7 is a block diagram of a serial data transceiver testing system 59 including a test unit 60 coupled to transceiver 30 (i.e., the transceiver under test). Test unit 60 is used to measure the amount of jitter within a serial data stream produced by transmitter 32 of transceiver 30. Test unit 60 includes a parallel data generator 62 and a parallel data comparator 64. During testing, test unit 60 generates the reference clock and control signals and provides the reference clock and control signals to transceiver 30. Parallel data generator 62 generates parallel input test data and provides the parallel input test data to the transmit data input port of transceiver 30. Transmitter 32 serializes the parallel input test data and differentially drives the pair of polarized transmitter output terminals with complementary voltage values representing the logic values of the resultant serial data stream. The polarized transmitter output terminals are coupled to the corresponding receiver input terminals. Receiver 34 of transceiver 30 receives the complementary voltage signals produced by transmitter 32, recovers the transmit clock signal from the corresponding serial data stream, samples the serial data stream in response to the control signal, aligns the resulting deserialized data into parallel units, and provides the resulting parallel test output data at the receive data output port.

As a first step during testing, test unit 60 may simply verify proper operation of transceiver 30. In order to accomplish this, test unit 60 may produce the control signal such that receiver 34 samples the serial data stream substantially midway between data transitions within the serial data stream. Parallel data generator 62 generates parallel input test data and provides the parallel input test data to the transmit data input port of transceiver 30. Parallel data comparator 64 receives the parallel output test data produced by transceiver 30 and the parallel input test data produced by parallel data generator 62. Parallel data comparator 64 compares the parallel output test data to the parallel input test data. A match between the parallel output test data and the parallel input test data (i.e., a one-to-one correspondence between the logic levels of the bit positions of the parallel output test data and the parallel input test data) verifies proper operation of transceiver 30.

FIG. 8 is a timing diagram which will be used to describe the operation of serial data transceiver testing system 59. The value of the control signal produced by test unit 60 causes receiver 34 of transceiver 30 to sample the serial data stream at time $t_S$ between a first data transition 66 and a second data transition 68. Following operational verification of transceiver 30, test unit 60 varies (i.e., increases or decreases) the value of the control signal such that receiver 34 samples the serial data stream closer and closer to first data transition 66 (i.e., earlier within each data window). The value of the control signal is preferably proportional to the sampling time $t_S$ within the data window or "eye" between first data transition 66 and second data transition 68. Parallel data comparator 64 receives the parallel output test data produced by receiver 34 of transceiver 30 and the parallel input test data produced by parallel data generator 62. Parallel data comparator 64 compares the parallel output test data to the parallel input test data. A match between the parallel output test data and the parallel input test data reveals the absence of jitter at sampling time $t_S$ within the data eye. In the absence of jitter, test unit 60 continues to vary (i.e., increase or decrease) the value of the control signal such that receiver 34 samples the serial data stream closer to first data transition 66. When the parallel output test data no longer matches the parallel input test data, jitter has been encountered in the serial data stream and a "leading edge" of the data eye has been located. Test unit 60 records the corresponding value of sampling time $t_{S1}$ for future use.

Once test unit 60 has determined the value of $t_{S1}$, test unit 60 varies (i.e., decreases or increases) the value of the control signal such that receiver 34 samples the serial data stream closer and closer to second data transition 68 (i.e., later within each data window). Parallel data comparator 64 continues to compare the parallel output test data produced by receiver 34 of transceiver 30 to the parallel input test data, and a match between the parallel output test data and the parallel input test data signifies the absence of jitter at sampling time $t_S$ within the data eye. In the absence of jitter, test unit 60 continues to vary (i.e., decrease or increase) the value of the control signal such that receiver 34 samples the serial data stream closer to second data transition 68. When the parallel output test data no longer matches the parallel input test data, jitter has again been encountered in the serial data stream and a "trailing edge" of the data eye has been located. Test unit 60 records the corresponding value of sampling time $t_{S2}$ for future use.

Once test unit 60 has determined the values of $t_{S1}$ and $t_{S2}$, test unit 60 determines the width of the data eye, preferably by simply subtracting the recorded value of $t_{S1}$ from the recorded value of $t_{S2}$. Test unit 60 then determines the amount of jitter in the serial data stream produced by transmitter 32 of transceiver 30 (i.e., transmitter jitter) by subtracting the data eye width from the period of the transmit clock signal (i.e., the "bit time" of the serial data stream). As described above, the transmit clock signal has a frequency n times the frequency of the reference clock signal provided by test unit 60, where n is the number of bits per data unit. Thus the bit time of the serial data stream is 1/n times the period of the reference clock signal.

FIG. 9 is a block diagram of an alternate embodiment of VCO 48. In the embodiment of FIG. 9, VCO 48 includes m pairs of non-inverting and inverting logic units (i.e., logic "blocks") connected in series to form a recirculating loop, where m is an odd number and twice the number of bits per data unit. Such a configuration resembles a ring oscillator. In FIG. 9, VCO 48 includes three block pairs 70*a–c*. Each block pair includes a non-inverting block 72 and an inverting block 74. Each logic block is coupled to a control unit 76, and has a variable time delay responsive to a delay control signal issued by control unit 76. Control unit 76 issues the delay control signals to the logic blocks in response to the filtered error signal from loop filter 40, the control signal from the control terminal, and the $Q_1$ and $Q_1'$ output signals. For example, assume non-inverting blocks 72*a–c* have a variable delay of $d_1$ and inverting blocks 74*a–c* have a variable delay of $d_2$. Control unit 76 adjusts the nominal values of $d_1$ and $d_2$ in response to the filtered error signal produced by loop filter 40 in order to maintain the periods of the $Q_1$ and $Q_1'$ waveforms equal to the time interval between data transitions within the serial data stream. Control unit 76 also varies $d_1$ and $d_2$ between minimum and maximum values in response to the control signal in order to alter the duty cycles of the $Q_1$ and $Q_1'$ waveforms. Control unit 76 alters the duty cycle of the $Q_1$ waveform in response to the control signal in order to facilitate measurement of the data eye width and transmitter jitter as described above. For example, in response to the control signal, control unit 76 may reduce the duty cycle of the $Q_1$ waveform by increasing the values of $d_1$ and $d_2$ when output signal $Q_1'$ is a logic high and reducing the values of $d_1$ and $d_2$ when output signal $Q_1$ is a logic high.

It will be appreciated by those skilled in the art having the benefit of this disclosure that this invention is believed to be a serial data transceiver architecture and test method for measuring the amount of jitter within a serial data stream. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A serial data transceiver formed upon a monolithic semiconductor substrate, said transceiver including a receiver comprising:

a deserializer coupled to receive a serial data stream comprising data windows separated by data transition periods, wherein the serial data stream has sufficient timing information to recover a transmit clock signal therefrom, and wherein the deserializer is configured to sample the serial data stream within each data window dependent upon the duty cycle of a timing signal in order to recover data from the serial data stream, and wherein the deserializer comprises:

a phase comparator coupled to receive the serial data stream and the transmit clock signal, wherein the phase comparator is configured to produce an a.c. error signal having a short term average value substantially proportional to the phase difference between the serial data stream and the transmit clock signal;

a loop filter coupled to receive the a.c. error signal and configured to produce a filtered error signal which is substantially the short term average value of the a.c. error signal;

a voltage-controlled oscillator (VCO) coupled to receive the filtered error signal and a control signal, wherein the VCO is configured to produce a clock signal, and wherein the frequency of the clock signal is dependent upon the filtered error signal and substantially equal to a number n times a frequency of the transmit clock signal, and wherein the VCO is configured to produce the timing signal, and wherein the duty cycle of the timing signal is dependent upon the value of the control signal; and a divide-by-n circuit coupled to receive the clock signal and configured to divide the frequency of the transmit clock signal by the number n to produce the transmit clock signal, wherein n is an integer greater than or equal to 1, wherein the VCO comprises a ramp generator coupled to a Schmitt trigger circuit, and wherein the ramp generator produces an output voltage which alternately increases and decreases linearly with time, and wherein the Schmitt trigger circuit is configured to produce the clock signal and the timing signal in response to the ramp generator output voltage.

2. The serial data transceiver as recited in claim 1, wherein the ramp generator comprises a current source coupled to a capacitor, and wherein the output of the current source alternates between two constant levels, and wherein the capacitor integrates the output of the current source with time to produce the ramp generator output voltage.

3. The serial data transceiver as recited in claim 2, wherein n is equal to 1, and wherein the current source adjusts the values of the two constant levels in response to the filtered error signal produced by the loop filter in order to maintain the period of the clock signal substantially equal to the time interval between the data transitions of the serial data stream.

4. The serial data transceiver as recited in claim 3, wherein the current source adjusts the values of the two constant levels in response to the control signal in order alter the duty cycle of the timing signal.

5. A serial data transceiver formed upon a monolithic semiconductor substrate, said transceiver including a receiver comprising:

a deserializer coupled to receive a serial data stream comprising data windows separated by data transition periods, wherein the serial data stream has sufficient timing information to recover a transmit clock signal therefrom, and wherein the deserializer is configured to sample the serial data stream within each data window dependent upon the duty cycle of a timing signal in order to recover data from the serial data stream, and wherein the deserializer comprises:

a phase comparator coupled to receive the serial data stream and the transmit clock signal, wherein the phase comparator is configured to produce an a.c. error signal having a short term average value substantially proportional to the phase difference between the serial data stream and the transmit clock signal;

a loop filter coupled to receive the a.c. error signal and configured to produce a filtered error signal which is substantially the short term average value of the a.c. error signal;

a voltage-controlled oscillator (VCO) coupled to receive the filtered error signal and a control signal, wherein the VCO is configured to produce a clock signal, and wherein the frequency of the clock signal is dependent upon the filtered error signal and substantially equal to a number n times a frequency of the transmit clock signal, and wherein the VCO is configured to produce the timing signal, and wherein the duty cycle of the timing signal is dependent upon the value of the control signal; and a divide-by-n circuit coupled to receive the clock signal and configured to divide the frequency of the transmit clock signal by the number n to produce the transmit clock signal, wherein n is an integer greater than or equal to 1, wherein the VCO comprises:

an odd number of pairs of non-inverting and inverting logic blocks arranged in a recirculating loop, wherein one of the pairs of logic blocks is configured to produce the clock signal and the timing signal, and wherein each logic block exhibits a time delay between the reception of an input signal and production of an output signal, and wherein the time delay is variable and dependent upon a delay control signal; and a control unit coupled to each logic block and configured to produce the delay control signal for each logic block.

6. The serial data transceiver as recited in claim 5, wherein n is equal to 1, and wherein the control unit is coupled to receive the filtered error signal from the loop filter, and wherein the control unit produces the delay control signals in response to the filtered error signal such that the period of clock signal is substantially equal to the time interval between the data transitions of the serial data stream.

7. The serial data transceiver as recited in claim 5, wherein the control unit is coupled to receive the control signal, and wherein the control unit produces the delay control signals in response to the control signal in order to alter the duty cycle of the timing signal.

8. A serial data transceiver formed upon a monolithic semiconductor substrate, said transceiver including a receiver comprising:

a deserializer coupled to receive a serial data stream comprising data windows separated by data transition periods, wherein the serial data stream has sufficient timing information to recover a transmit clock signal therefrom, and wherein the deserializer is configured to sample the serial data stream within each data window dependent upon the duty cycle of a timing signal, and wherein the deserializer comprises:

a phase comparator coupled to receive the serial data stream and a frequency-divided transmit clock signal, wherein the phase comparator is configured to produce an a.c. error signal having a short term average value substantially proportional to the phase difference between the serial data stream and the frequency-divided transmit clock signal;

a loop filter coupled to receive the a.c. error signal and configured to produce a filtered error signal which is substantially the short term average value of the a.c. error signal;

a voltage-controlled oscillator (VCO) coupled to receive the filtered error signal and a control signal, wherein the VCO is configured to produce the transmit clock signal, and wherein the frequency of the transmit clock signal is dependent upon the filtered error signal and a number n, and wherein the VCO is configured to produce the timing signal, and wherein the duty cycle of the timing signal is dependent upon the value of the control signal; and a divide-by-n circuit coupled to receive the transmit clock signal and configured to divide the frequency of the transmit clock signal by the number n to produce the transmit clock signal, wherein n is an integer greater than or equal to 1, wherein the VCO comprises a ramp generator coupled to a Schmitt trigger circuit, and wherein the ramp generator produces an output voltage which alternately increases and decreases linearly with time, and wherein the Schmitt trigger circuit is configured to produce the recovered transmit clock signal and the timing signal in response to the ramp generator output voltage.

9. The serial data transceiver as recited in claim 8, wherein the ramp generator comprises a current source coupled to a capacitor, and wherein the output of the current source alternates between two constant levels, and wherein the capacitor integrates the output of the current source with time to produce the ramp generator output voltage.

10. The serial data transceiver as recited in claim 9, wherein the current source adjusts the values of the two constant levels in response to the filtered error signal produced by the loop filter in order to maintain the period of the recovered transmit clock signal substantially equal to the time interval between the data transitions of the serial data stream.

11. The serial data transceiver as recited in claim 9, wherein the current source adjusts the values of the two constant levels in response to the control signal in order alter the duty cycle of the timing signal.

12. A serial data transceiver formed upon a monolithic semiconductor substrate, said transceiver including a receiver comprising:

a deserializer coupled to receive a serial data stream comprising data windows separated by data transition periods, wherein the serial data stream has sufficient timing information to recover a transmit clock signal therefrom, and wherein the deserializer is configured to sample the serial data stream within each data window dependent upon the duty cycle of a timing signal, and wherein the deserializer comprises:

a phase comparator coupled to receive the serial data stream and a frequency-divided transmit clock signal, wherein the phase comparator is configured to produce an a.c. error signal having a short term average value substantially proportional to the phase difference between the serial data stream and the frequency-divided transmit clock signal;

a loop filter coupled to receive the a.c. error signal and configured to produce a filtered error signal which is substantially the short term average value of the a.c. error signal;

a voltage-controlled oscillator (VCO) coupled to receive the filtered error signal and a control signal, wherein the VCO is configured to produce the transmit clock signal, and wherein the frequency of the transmit clock signal is dependent upon the filtered error signal and a number n, and wherein the VCO is configured to produce the timing signal, and wherein the duty cycle of the timing signal is dependent upon the value of the control signal; and a divide-by-n circuit coupled to receive the clock signal and configured to divide the frequency of the transmit clock signal by the number n to produce the frequency-divided transmit clock signal, wherein n is an integer greater than or equal to 1, wherein the VCO comprises:

an odd number of pairs of non-inverting and inverting logic blocks arranged in a recirculating loop, wherein one of the pairs of logic blocks is configured to produce the recovered transmit clock signal and the timing signal, and wherein each logic block exhibits a time delay between reception of an input signal and production of an output signal, and wherein the time delay is variable and dependent upon a delay control signal; and a control unit coupled to each logic block and configured to produce the delay control signal for each logic block.

13. The serial data transceiver as recited in claim 12, wherein the control unit is coupled to receive the filtered error signal from the loop filter, and wherein the control unit produces the delay control signals in response to the filtered error signal such that the period of the recovered transmit clock signal is substantially equal to the time interval between the data transitions of the serial data stream.

14. The serial data transceiver as recited in claim 12, wherein the control unit is coupled to receive the control signal, and wherein the control unit produces the delay control signals in response to the control signal in order to alter the duty cycle of the timing signal.

* * * * *